United States Patent [19]
Hoffmann et al.
[11] 4,454,431
[45] Jun. 12, 1984

[54] SEMICONDUCTOR CIRCUIT WITH A CIRCUIT PART CONTROLLED BY A SUBSTRATE BIAS

[75] Inventors: Kurt Hoffmann, Taufkirchen; Dieter Kantz, Munich, both of Fed. Rep. of Germany

[73] Assignee: Siemens Aktiengesellschaft, Berlin and Munich, Fed. Rep. of Germany

[21] Appl. No.: 240,197

[22] Filed: Mar. 3, 1981

[30] Foreign Application Priority Data

Mar. 11, 1980 [DE] Fed. Rep. of Germany ....... 3009303

[51] Int. Cl.$^{3}$ ...................... H03K 17/22; H03K 17/06; H03K 17/10

[52] U.S. Cl. ................................ 307/296 R; 307/591; 307/592

[58] Field of Search ................................ 307/591–594, 307/597, 296 R, 296 A, 361, 317, 318, 320, 322, 297 R, 491

[56] References Cited

U.S. PATENT DOCUMENTS 3,794,862 2/1974 Jenne .................................. 307/304
3,838,357 9/1974 Billeg, Jr. ......................... 307/592 X
4,296,340 10/1981 Horan ................................ 307/550

FOREIGN PATENT DOCUMENTS 2812378 9/1979 Fed. Rep. of Germany .
55-25220 2/1980 Japan ............................. 307/296 A
55-71058 5/1980 Japan ............................. 307/296 R
2028553 8/1978 United Kingdom ................ 307/297
2020502 11/1979 United Kingdom .

OTHER PUBLICATIONS

Frantz et al., *MOSFET Substrate Self-Biasing*, IBM Tech. Discl. Bull., vol. 13, No. 8, pp. 2385–2386, Jan.-71.

Gladstein et al., *FET Substrate Generator Derived from Low Voltage Power Supply*, IBM Tech. Discl. Bull., vol. 21, No. 12, pp. 4935–4936, May-79.

*Primary Examiner*—Larry N. Anagnos
*Assistant Examiner*—David R. Bertelson
*Attorney, Agent, or Firm*—Herbert L. Lerner; Laurence A. Greenberg

[57] ABSTRACT

A semiconductor circuit assembly having capacitively controlled field effect transistors, includes a semiconductor chip containing a digital circuit part for supplying timing pulses for controlling operation of the digital circuit part, and terminal having at least one conductive connection to the digital circuit part and the timing pulse generator for supplying potentials thereto from a direct current source. An oscillator is provided and a substrate-bias generator connected to the oscillator and the timing pulse generator. The substrate-bias generator is controlled by the oscillator for producing a bias voltage able to reach a given full value and for activating the timing pulse generator only after the substrate bias voltage has reached its full value.

4 Claims, 1 Drawing Figure

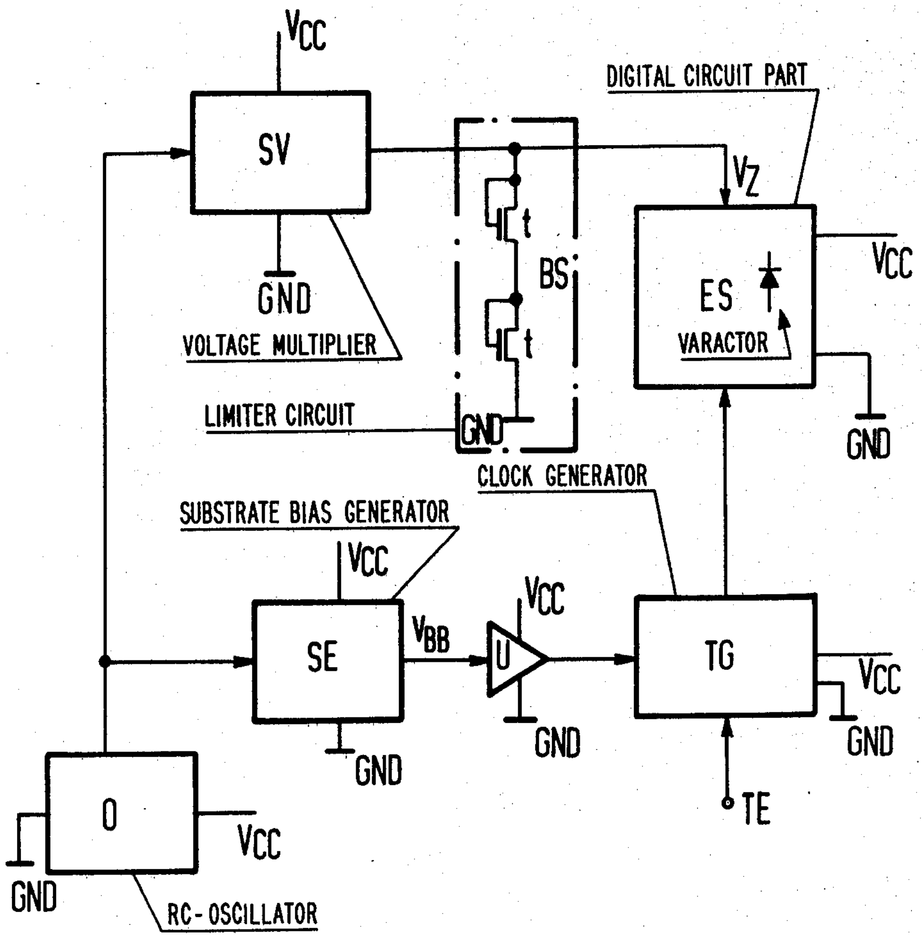
VCC
SV
GND
VOLTAGE MULTIPLIER
DIGITAL CIRCUIT PART
VZ
t
t
BS
ES
VARACTOR
VCC
GND
LIMITER CIRCUIT
GND
CLOCK GENERATOR
SUBSTRATE BIAS GENERATOR
VCC
VCC
SE
VBB
U
TG
VCC
GND
GND
GND
TE
0
VCC
GND
RC-OSCILLATOR

SEMICONDUCTOR CIRCUIT WITH A CIRCUIT PART CONTROLLED BY A SUBSTRATE BIAS

The invention relates to a integrated digital circuit with capacitatively controlled field effect transistors, including a timing pulse generator which supplies the timing impulses for controlling the operation of the digital semiconductor circuit itself. At the semiconductor chip, which contains the actual digital conductor circuit and also the timing pulse generator, there are provided supply terminals for respective potentials from a direct current source. The potentials are applied with at least one conductive connection each to the actual digital semiconductor circuit and the timing pulse generator.

In digital semiconductor circuits, there are frequently not only two operating potentials required, but also an additional operating potential for generating a substrate bias voltage between the back of the semiconductor chip and the circuit components on the front of the chip. If a timing generator is provided in the circuit, in order to avoid destruction of the integrated circuit, the timing pulse generator should be only turned on after the substrate bias voltage $V_{BB}$ has been built up to its full value. Furthermore, in many digital circuits, such as for dynamic accumulators (for storage), it is of interest to have an auxiliary potential $V_z$ available which exceeds the voltage difference between the two connections of the semiconductor chip, especially in case the circuit contains varactor condensers or capacitors which have to be charged.

It is accordingly an object of the invention to provide an integrated digital semiconductor circuit which overcomes the hereinafter-mentioned disadvantages of the heretofore-known devices of this general type.

With the foregoing and other objects in view there is provided, in accordance with the invention, a semiconductor circuit assembly having capacitively controlled field effect transistors, including a semiconductor chip containing a digital circuit part, a timing pulse generator connected to the digital circuit part for supplying timing pulses for controlling operation of the digital circuit part, and terminals having at least one conductive connection to the digital circuit part and the timing pulse generator for supplying potentials thereto from a direct current source, comprising an oscillator, and a substrate-bias generator being connected to the oscillator and timing pulse generator, the substrate-bias generator being controlled by the oscillator for producing a bias voltage able to reach given full value and for activating the timing pulse generator only after the substrate bias voltage has reached its full value.

In accordance with another feature of the invention, the substrate-bias generator has an output for supplying the bias voltage, and the timing pulse generator has an activating input, and there is provided a converter connected between the output and the input, the converter being operable to supply an activating signal to the timing pulse generator when the bias voltage has reached its full value.

In accordance with a further feature of the invention, there is provided a voltage multiplier or doubling circuit being connected to and controlled by the oscillator for supplying an additional operating potential to the digital semiconductor circuit.

This additional operating potential serves for supplying MOS-condensers, which, for example, are used as storage condensers. However, it can also serve for operating the actual integrated circuit ES as the required second operating potential instead of $V_{CC}$.

In accordance with an added feature of the invention, the additional operating potential is at a raised value, and the first-mentioned potentials includes a reference ground potential, and there is provided a limiter circuit, the raised operating potential supplied by the voltage multiplier circuit being connected to the reference potential through the limiter circuit.

In accordance with an additional feature of the invention, the limiter circuit comprises a plurality of series-connected MOS-field effect transistors each being similarly connected to form resistances or in the form of diodes similarly connected in reverse blocking direction.

In accordance with a concomitant feature of the invention, the additional operating potential is stabilized or the bias voltage is stabilized such as by means of a regulating circuit.

Other features which are considered as characteristic for the invention are set forth in the appended claims.

Although the invention is illustrated and described herein as embodied in a digital semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying single figure of the drawing which is a schematic and block diagrammatic view of an integrated digital semiconductor circuit corresponding to the invention.

Referring now particularly to the FIGURE of the drawing, it is seen that the two supply terminals of the semiconductor chip which carries the circuit, are connected to the operating potentials $V_{cc}$ and GND which are in turn connected to the individual circuit parts as shown in the drawing. The actual path of these conductors is not shown. Besides the actual digital semiconductor circuit ES, the following circuit parts are provided:

The circuit includes an oscillator O with its operating voltage supplied from the operating potentials $V_{CC}$ and GND (operating voltage and ground). The oscillator is constructed as an RC-oscillator.

The oscillator O furnishes rectangular pulses of equal amplitude, which serve for the control of the substrate bias potential generator and the voltage multiplier, such as a voltage doubler, for example. The voltage multiplier is designated with reference symbol SV, and the substrate bias potential generator is designated with reference symbol SE.

A pulsed substrate bias potential generator SE with an oscillator O provided in the form of a clock pulse generator, is described in German Published, Non-Prosecuted Application DE-OS No. 28 12 378 entitled "Semiconductor circuit with at least two field-effect transistors which are united in a semiconductor crystal". The circuit of a substrate bias potential generator as shown in FIG. 1 of this application can be directly used.

The timing pulse generator TG for the integrated digital semiconductor circuit ES itself is supplied, through an input TE, with square (rectangular) pulses from an external pulse generator. The timing pulse generator serves to produce the timing signals required for the operation of the actual digital semiconductor circuit from the primary pulses received through the input TE. The supply voltages $V_{CC}$ and GND are provided for the timing pulse generator TG as well as for the substrate bias potential generator SE and for the converter U connected between them.

The converter or inverter U is also supplied by the two operating voltages $V_{cc}$ and GND. The converter serves the purpose of giving an activating signal, as soon as the substrate bias voltage supplied by the substrate bias generator is fully built up. Thus, it is the purpose of the potential supplied by the converter U to set the timing pulse generator TG in operation only when the substrate bias voltage $V_{BB}$ has reached its specified value. The converter U can be a differential amplifier. Because of the presence of the converter U, the digital semiconductor circuit ES itself, such as a semiconductor accumulator, is not set in operation before the substrate bias voltage has reached its full value, and it is not damaged by the short circuit current flowing under this condition.

A pulsed voltage doubler SV is described in German Published, NonProsecuted Application DE-OS No. 28 11 418 entitled "Timing pulse controlled direct current converter". The circuit described therein can also be used for a direct current multiplier with a different whole number ratio between input and output voltages. The oscillator described therein can directly replace the timing oscillator O which is provided for the substrate bias potential generator SE. The voltage multiplier SV has the task of generating the required higher direct current operating voltage for the actual digital semiconductor circuit, as required, for example, for charging of accumulator capacities.

The output of the voltage multiplier is connected to the ground potential GND through a limiter-circuit BS. Furthermore, the output of the multiplier SV is connected to an additional supply input of the actual digital semiconductor circuit ES, and carries the additionally raised operating potential $V_z$, which is needed for operating selected circuit components, for example for charging accumulator capacitors.

In contrast, the substrate bias potential or voltage $V_{BB}$ which is supplied from the substrate bias potential generator SE, is shared by all circuit components in the semiconductor chip. As already stated, the operating potential $V_{CC}$ is supplied to the circuit parts O, SE, U, TG, and SV. The operating potential $V_{cc}$ also serves as the main operating potential for the integrated circuit ES itself. The same applies for the reference potential GND.

The limiter circuit BS can, for example, include two or more series-connected MOS-field transistors t, which are connected as resistors in the circuit by connecting their drains to their gates. The source of the last of these transistors t lies at the reference potential GND. The number of the series connected transistors t depends on the number of the field effect transistors in the voltage multiplier SV which are connected in series with respect to the two operating potentials $V_{CC}$ and GND. The transistors t can also be diodes which are connected in the reverse or blocking direction.

There is claimed:

1. Semiconductor circuit, comprising an operating potential source, a reference potential source, a digital circuit part connected to said potential sources, a clock generator connected to said circuit part and to said potential sources, an oscillator connected to said potential sources, a voltage multiplier connected to said potential sources and connected to and controlled by said oscillator, a connection between said voltage multiplier and said digital circuit part for feeding a supply voltage to said digital circuit part being higher than the voltages provided by said potential sources, a limiter circuit formed of MOS transistors connected between said reference potential source and said connection between said voltage multiplier and said digital circuit part, a substrate bias generator connected between said potential sources and to said oscillator for supplying a substrate bias having a given full value, and a converter connected to said potential sources and connected between said substrate bias generator and said clock generator for receiving said substrate bias from said substrate bias generator and for passing on said substrate bias to said clock generator, said clock generator and said digital circuit part being activated when said substrate bias reaches said given full value.

2. Circuit according to claim 1, wherein said digital circuit part includes varactor diodes being charged by said supply voltage fed by said voltage multiplier.

3. Circuit according to claim 1, wherein said limiter circuit comprises a plurality of series-connected MOS-field effect transistors each being similarly connected to form resistances.

4. Circuit according to claim 1, wherein said limiter circuit comprises a plurality of series-connected MOS-field effect transistors each being in the form of diodes similarly connected in reverse blocking direction.

* * * * *